(12) United States Patent
Choe

(10) Patent No.: US 7,319,619 B1
(45) Date of Patent: Jan. 15, 2008

(54) PROGRAMMABLE LOGIC DEVICE MEMORY BLOCKS WITH ADJUSTABLE TIMING

(75) Inventor: Kok Heng Choe, Penang (MY)

(73) Assignee: Altera Corporation, San Jose, CA (US)

( * ) Notice: Subject to any disclaimer, the term of this patent is extended or adjusted under 35 U.S.C. 154(b) by 88 days.

(21) Appl. No.: 11/357,629

(22) Filed: Feb. 16, 2006

(51) Int. Cl.
*G11C 7/00* (2006.01)
*G11C 8/00* (2006.01)

(52) U.S. Cl. .......................... 365/189.05; 365/189.08; 365/189.12; 365/194; 365/230.05; 365/230.06; 365/230.08

(58) Field of Classification Search ............ 365/189.05, 365/189.08, 189.12, 194, 230.05, 230.06, 365/230.08, 233; 326/37, 38, 39
See application file for complete search history.

(56) References Cited

U.S. PATENT DOCUMENTS

| | | | | |
|---|---|---|---|---|
| 5,430,687 A | * | 7/1995 | Hung et al. | ............ 365/230.08 |
| 5,734,927 A | * | 3/1998 | Boutaud et al. | ............ 365/233 |
| 5,920,213 A | | 7/1999 | Graf, III et al. | |
| 5,990,702 A | | 11/1999 | Agrawal et al. | |
| 6,034,542 A | * | 3/2000 | Ridgeway | .................... 326/38 |
| 6,150,863 A | | 11/2000 | Conn et al. | |
| 6,157,210 A | * | 12/2000 | Zaveri et al. | ................. 326/39 |
| 6,239,611 B1 | | 5/2001 | Matera | |
| 6,430,088 B1 | * | 8/2002 | Plants et al. | ........... 365/230.05 |
| 6,853,215 B1 | | 2/2005 | Nguyen et al. | |

\* cited by examiner

*Primary Examiner*—Trong Phan
(74) *Attorney, Agent, or Firm*—G. Victor Treyz

(57) ABSTRACT

Programmable logic device integrated circuits with adjustable register and memory address decoder circuitry are provided. The integrated circuits contain programmable memory blocks and programmable logic that is configured by a user. Depending on the type of user logic that is implemented by the user, the programmable logic device integrated circuit may have different timing needs for its memory blocks. The adjustable register and memory address decoder circuitry has associated programmable elements that are loaded with configuration data. The configuration data adjusts the timing characteristics of the adjustable register and memory address decoder circuitry to accommodate the user logic. The adjustable register and memory address decoder circuitry may be used to make setup and clock-to-output timing adjustments to optimize a logic design.

20 Claims, 9 Drawing Sheets

| SW1 | SW2 | SW3 | $T_{su1}$ | $T_{co2}$ |
|---|---|---|---|---|
| 1 | 0 | 0 | N2-N3A | N3A'-N5 |
| 0 | 1 | 0 | N2-N3B | N3B'-N5 |
| 0 | 0 | 1 | N2-N3C | N3C'-N5 |

FIG. 7

PROGRAMMABLE LOGIC DEVICE MEMORY BLOCKS WITH ADJUSTABLE TIMING

BACKGROUND

This invention relates to programmable logic device integrated circuits, and more particularly, to programmable logic devices with memory decoder circuitry that may be adjusted to optimize timing constraints.

Programmable logic devices are a type of integrated circuit that can be programmed by a user to implement a desired custom logic function. In a typical scenario, a logic designer uses computer-aided design (CAD) tools to design a custom logic circuit. These tools help the designer to implement the custom logic circuit using the resources available on a given programmable logic device. When the design process is complete, the CAD tools generate configuration data files. The configuration data is loaded into programmable logic devices to configure them to perform the desired custom logic function.

Programmable logic devices generally contain programmable memory elements into which the configuration data is loaded during device programming. With one suitable arrangement, programmable memory elements are implemented using volatile memory elements. These memory elements are often referred to as configuration random-access memory (CRAM). Once loaded, each CRAM cell produces a static output signal that controls a transistor or other electronic component in a region of programmable logic.

Programmable logic devices also generally contain blocks or regions of random-access memory (RAM). These memory blocks, which are sometimes referred to as embedded array blocks (EABs) are used to handle the storage needs of the circuitry on the device. During normal operation of a programmable logic device, the hardwired and programmable circuitry of the device performs read and write operations on the memory of the blocks. Memory blocks on a programmable logic device typically range in size from a few kilobits to about a megabit or more.

Data can be written to and read from an array of RAM cells in a memory block using bit lines. The array of memory cells in each memory block is addressed using an address decoder. Each address decoder receives address signals and coverts them into word line signals for addressing the memory cells in the array.

To allow sufficient time for the memory circuitry on a programmable logic device to operate properly, logic designers must ensure that their design satisfies certain timing constraints. For example, a logic designer must ensure that setup time (Tsu) and clock-to-output time (Tco) constraints are satisfied by the design. If these constraints are violated, the programmable logic device may not function satisfactorily.

The timing characteristics of conventional memory decoders are fixed, which can adversely affect the performance of certain logic designs. For example, a logic designer may only be able to satisfy certain setup time and clock-to-output time constraints in the programmable logic device by reducing the frequency at which the programmable logic device is allowed to operate in a system. Such compromises may not always be acceptable to the designer.

It would therefore be desirable to be able to adjust timing characteristics in the memory decoder circuitry of a programmable logic device so that a logic designer can improve circuit performance.

SUMMARY

In accordance with the present invention, programmable logic device integrated circuits are provided that contain memory blocks. The memory blocks each contain a memory array such as an array of random-access-memory (RAM). The RAM arrays in the memory blocks are addressed using word lines.

Adjustable register and memory address decoder circuits are provided for some or all of the memory blocks on each programmable logic device. Each adjustable register and memory address decoder circuit contains a master latch circuit that receives undecoded address signals. Each adjustable register and memory address decoder circuit also contains multiple gated clock circuits.

Clock signals with different amounts of delay are used to clock logic gates in each of the gated clock circuits. Clock signal distribution paths are selectively enabled or disabled using switches controlled by configuration data bits. When a given one of the gated clock circuits is switched into use, the logic gates in the gated clock circuit receive the clock signal being applied to that gated clock circuit.

The logic gates in the given gated clock circuit receive the address signals from the master latch circuit. These logic gates serves as slave latches that work with master latches in the master latch circuit to form master-slave registers. The time at which the undecoded address signals are clocked in the adjustable register and memory address decoder circuit is adjusted by using the configuration data to select which of the gated clock circuits is active. By adjusting the timing characteristics of the adjustable register and memory address decoding circuitry, the performance of the programmable logic device may be optimized to accommodate different logic designs.

Further features of the invention, its nature and various advantages will be more apparent from the accompanying drawings and the following detailed description of the preferred embodiments.

BRIEF DESCRIPTION OF THE DRAWINGS

FIG. 7 is a table showing the setup times and clock-to-output times associated with the memory block decoder circuitry of FIG. 6 in various decoder timing configurations in accordance with the present invention.

DETAILED DESCRIPTION

The present invention relates to programmable logic devices and adjustable programmable logic device memory decoder circuitry. The invention also relates to methods for testing and using programmable logic devices with adjustable memory decoders. If desired, the decoder circuitry of the present invention may be used in programmable integrated circuits that are not traditionally referred to as programmable logic devices. For example, adjustable memory decoder circuitry can be used in a microprocessor, a digital signal processor, a memory chip, a custom logic chip, or other programmable integrated circuit that contains programmable logic and one or more memory blocks. For clarity, the present invention will generally be described in the context of programmable logic device integrated circuits.

Figure 1:
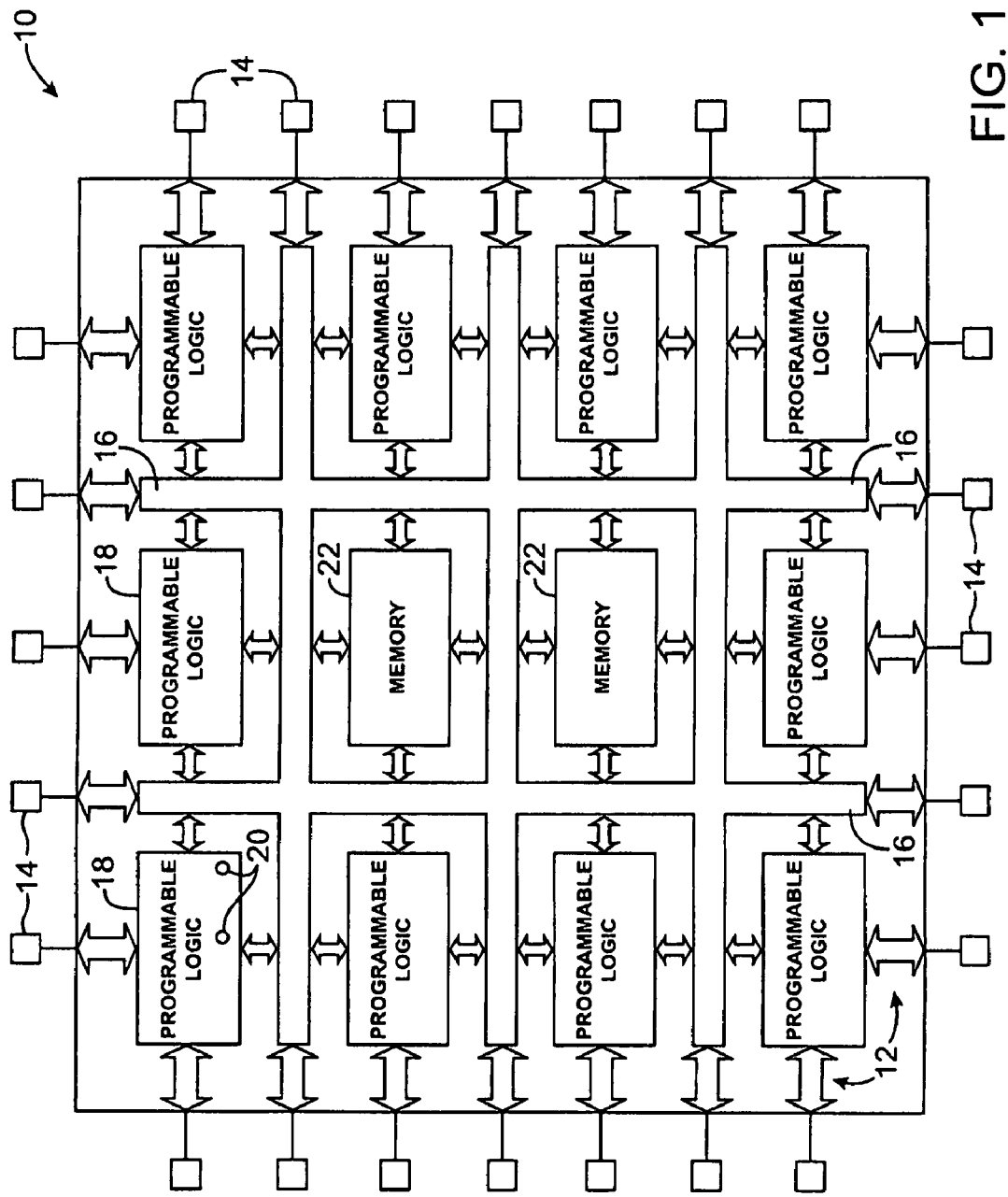
FIG. 1 is a diagram of an illustrative programmable logic device integrated circuit in accordance with the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects).

Programmable logic device 10 contains programmable logic 18 and memory blocks 22.

Programmable logic 18 may include combinational and sequential logic circuitry. The programmable logic 18 may be configured to perform a custom logic function. The programmable interconnects associated with interconnection resources 16 may be considered to be a part of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory or configuration RAM.

Memory blocks 22 contain arrays of volatile memory elements such as random-access-memory (RAM) cells. The memory blocks 22 are used to store data signals during normal operation of device 10. The memory blocks 22 need not all be the same size. For example, small, medium, and large memory blocks 22 may be included on the same programmable logic device. In general, there may be any suitable number of regions of programmable logic 18 and any suitable number of memory blocks 22 on device 10.

Configuration memory elements 20 may be loaded from an external erasable-programmable read-only memory and control chip via pins 14 and input/output circuitry 12. The outputs of the loaded memory elements 20 are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by interconnection resources 16. Interconnection resources 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic 18 that are shown in FIG. 1, the device 10 generally also includes some programmable logic 18 within interconnect resources 16, memory 22, and input-output circuitry 12. For example, input-output circuitry 12 may contain programmable input and output buffers. Interconnects 16 may be programmed to route data signals to a desired destination. In accordance with the present invention, memory blocks 22 contain memory decoder circuitry that is based at least partly on programmable logic.

When implementing a desired logic design in a programmable logic device, it is important that all design constraints be satisfied. Some design constraints are imposed on a logic designer due to resource availability. For example, it is not possible to implement a logic design that uses more registers than are available on the device. Other design constraints relate to timing. For example, it is not possible to implement a design that requires signals to operate a frequency above a maximum allowable frequency fmax.

Two important timing constraints that are often encountered in designing circuits for programmable logic devices are related to the so-called setup time and clock-to-output time. Setup time and clock-to-output time constraints are illustrated in connection with the circuit example of FIG. 2.

Figure 2:
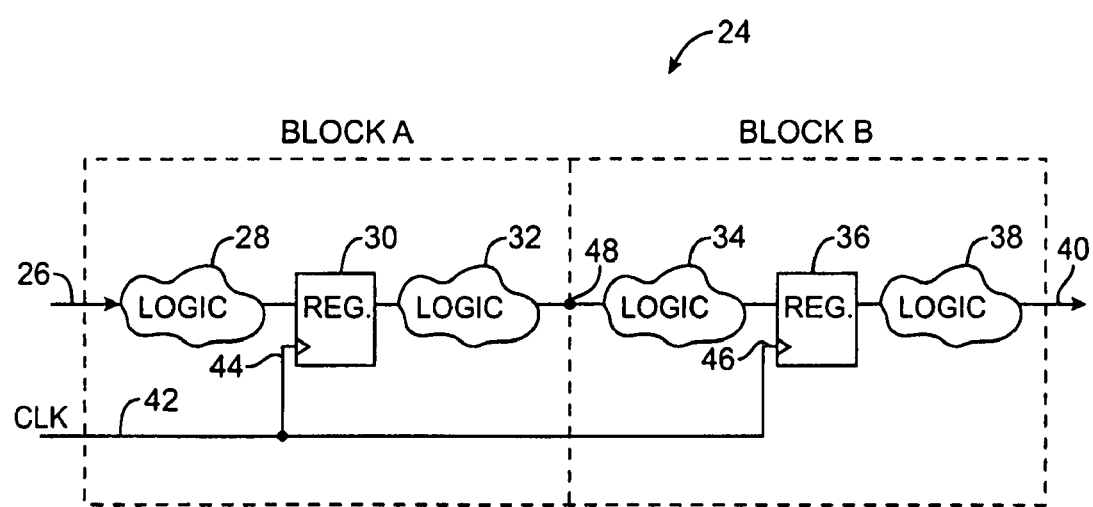
FIG. 2 is a diagram of two blocks of logic circuitry with corresponding setup time and clock-to-output time constraints.

In the illustrative circuit 24 of FIG. 2, there are two interconnected blocks of logic circuitry: block A and block B. Signals travel from input 26 to output 40 through user-configured programmable logic 28 (sometimes called user logic), register 30, user logic 32, user logic 34, register 36, and user logic 38. A clock CLK is distributed by path 42 to the clock input 44 of register 30 and the clock input 46 of register 36.

The amount of delay imposed by the user logic 28, 32, 34, and 38 depends on the logic design chosen by the user. To ensure that circuit 24 operates properly, the delay associated with logic 28, 32, 34, and 38 must be such that the setup time Tsu and clock-to-output time Tco requirements associated with circuit 24 are satisfied.

The setup time of block A is the time that the signal on input 26 must be valid before the clock signal on input 44 is allowed to go high. The setup time of block B is the time that the signal on node 48 must be valid before the clock signal on input 44 is allowed to go high. These setup times are related to the delay associated with logic 28 and logic 34, respectively.

The clock-to-output time of block A is the amount of time after CLK goes high at input 44 at which data at node 48 is considered valid. The clock-to-output time of block B is the amount of time after CLK goes high at input 46 at which data at output 40 is valid. The clock-to-output times of blocks A and B are related to the amount of delay for logic 32 and logic 38, respectively.

The maximum frequency at which the circuit 24 can operate is dictated by the larger of $(Tsua+Tcoa)^{-1}$ and $(Tsub$ and $Tcob)^{-1}$, where Tsua and Tcoa are the setup time and clock-to-output time of block A, respectively, and where Tsub and Tcob are the setup time and clock-to-output time of block B, respectively. If any one of these times is particularly large, the performance of the programmable logic device may not be optimum. For example, the operating frequency of the clock signal may need to be reduced or the design may need to be altered to ensure satisfactory operation.

As with the illustrative circuit 24 of FIG. 2, the circuitry of memory blocks 22 has associated setup and clock-to-output constraints. In conventional programmable logic devices, the memory block circuitry is fixed and cannot be adjusted to accommodate different Tsu and Tco configurations. In accordance with the present invention, however, a logic designer can adjust the timing behavior of the circuitry in memory blocks 22. By adjusting the internal timing of memory blocks 22, logic designs with particular timing requirements can be satisfied and the performance of the programmable logic device can be improved.

For example, if a design requires that a smaller Tsu be associated with a particular circuit, the memory block 22 can be adjusted to increase Tco in another part of the circuit. This increase in Tco allows the reduction to be made in Tsu without changing the clock speed of the device.

As another example, it may be possible to increase the maximum clock speed of a given design by making appropriate tradeoffs between Tsu and Tco.

Figure 3:
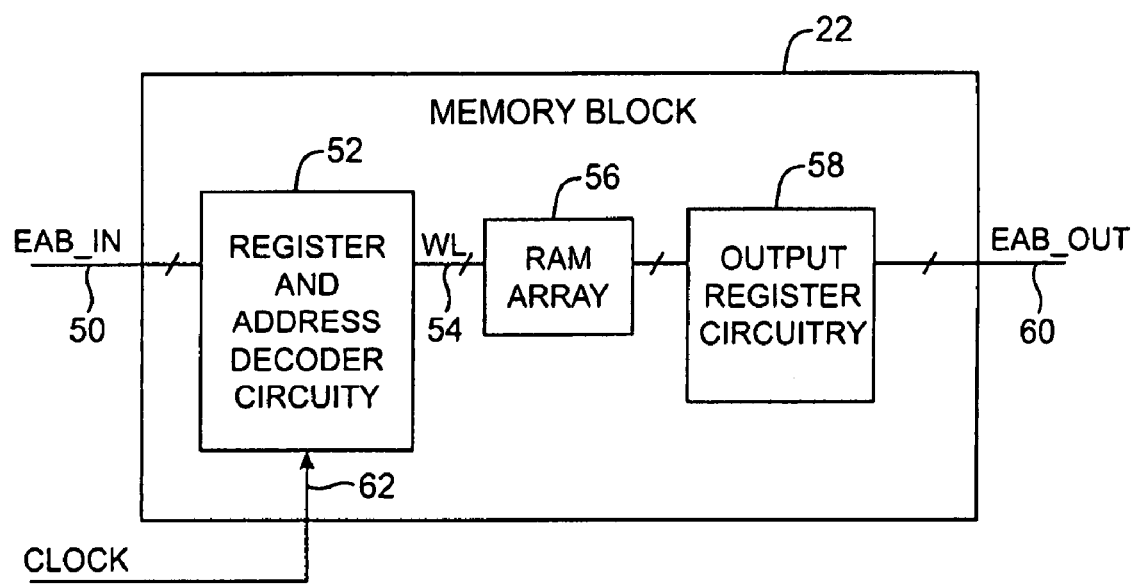
FIG. 3 is a diagram of an illustrative memory block of the type that may be used in a programmable logic device in accordance with the present invention.

Memory blocks 22 contain address decoder circuitry. The circuitry of an illustrative memory block 22 is shown in FIG. 3. As shown in FIG. 3, each memory block 22 contains an array of volatile memory elements (labeled RAM). Memory array 56 is addressed (for writing or reading) using word lines 54. Undecoded address signals are received at the EAB_IN input on lines 50. Register and address decoder circuitry 52 registers and decodes the address signals and generates corresponding word line address signals on word lines 54. A clock signal is applied to the registers in register and address decoder circuitry 52 via input 62.

During a read operation, the addressed contents of RAM array 56 is provided to output register circuitry 58. Output register circuitry 58 contains bypassable register logic. After passing through output register circuitry 58, the data signals from RAM array 56 are provided at output EAB_OUT on lines 60.

The timing characteristics of register and address decoder circuitry 52 can be adjusted by loading appropriate configuration data into the programmable logic device during programming. The adjustments made to register and address decoder circuitry 52 can be used to improve device performance by making tradeoffs between Tsu and Tco.

Figure 4:
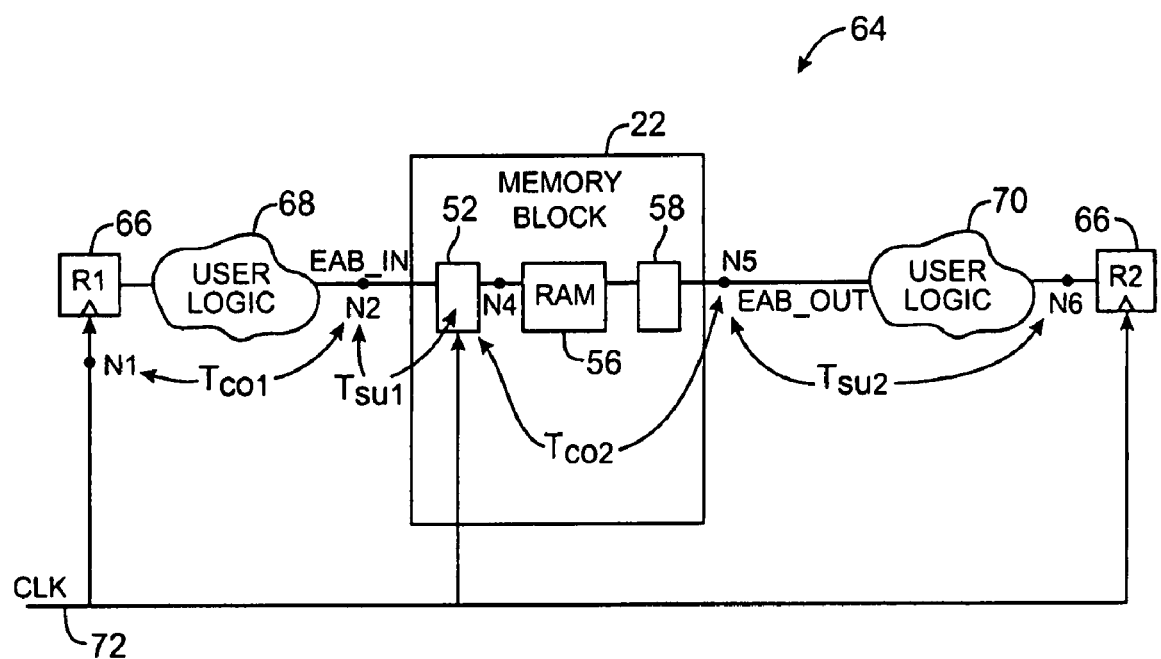
FIG. 4 is a diagram of illustrative programmable logic device circuitry containing a memory block with an adjustable memory decoder in accordance with the present invention.

The use of adjustments to register and address decoder circuitry 52 to alter the performance of a programmable logic device memory block 22 is illustrated in connection with FIG. 4. The diagram of FIG. 4 shows circuitry 64 on a programmable logic device integrated circuit 10 that contains two illustrative registers 66 (labeled R1 and R2). In the example of FIG. 4, data is passing from register R1 to register R2 through memory block 22. The type of circuitry that the logic designer includes in user-configured programmable logic regions 68 and 70 affects the timing of signals passing through circuitry 64. If, for example, relatively more logic is included in user logic 68, signals will take relatively longer to pass through the first part of circuitry 64. If, as another example, relatively less logic is included in user logic 68, signals will pass more quickly through the first part of circuitry 64. These types of variations in delay must be taken into account if the circuitry 64 is to perform optimally.

The input to the memory block 22 in FIG. 4 is labeled EAB_IN. The output of the memory block 22 is labeled EAB_OUT. The data paths in FIG. 4 typically contain multiple parallel signals. For example, register and address decoder circuitry 52 and output register circuitry 58 generally each have multi-line inputs and outputs. Labels N1, N2, N5, and N6 indicate various signal locations as data passes through circuitry 64 from register R1 to register R2. Clock signals are applied to circuitry 64 from a source of clock signals supplied at path 72.

Figure 5:
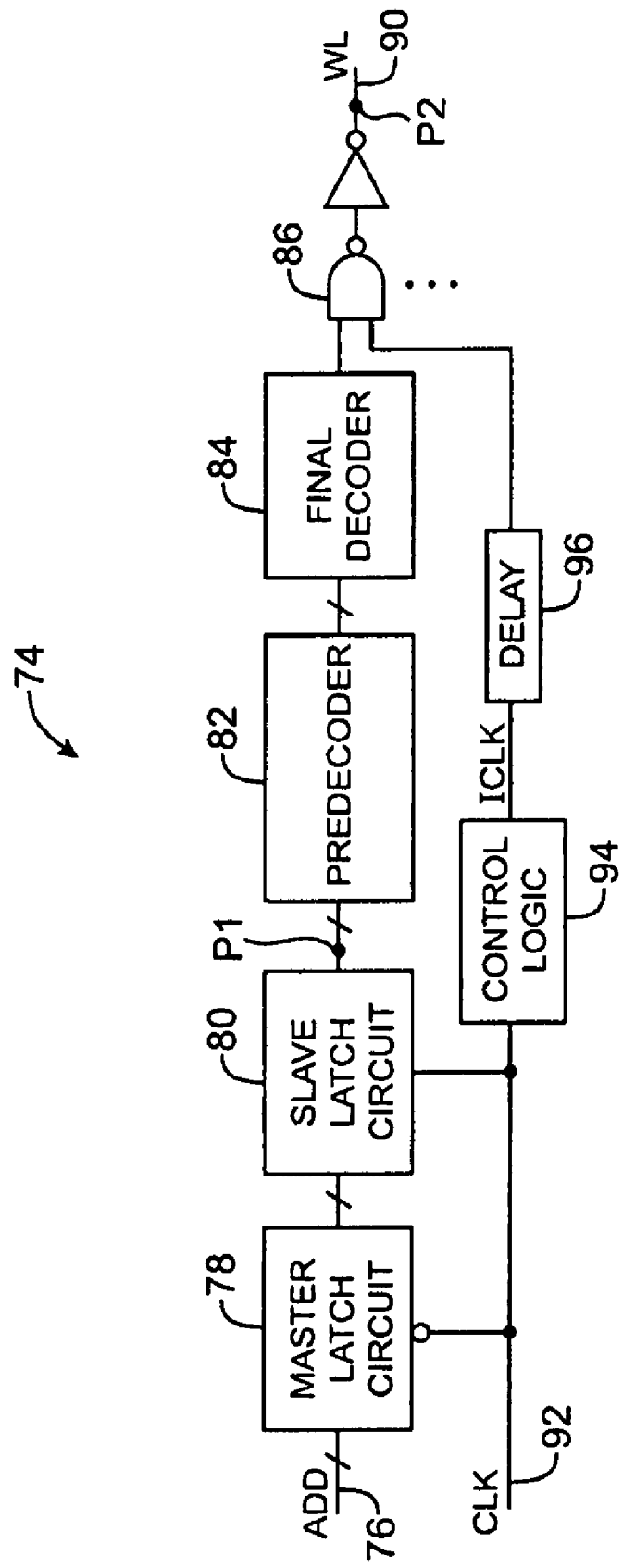
FIG. 5 is a diagram of a conventional unadjustable programmable logic device embedded array block memory decoder.

Conventional memory block register and address decoder circuitry 74 is shown in FIG. 5. Circuit 74 may be used in a memory block circuit of the type shown in FIG. 4. Undecoded address signals ADD are applied to input 76. Master latch circuit 78 contains multiple latches, each latch receiving a respective one of the undecoded address signals on its input and providing a latched version of the undecoded address signal on its output. Slave latch circuit 80 contains multiple latches, each latch receiving a respective one of the undecoded address signals on its input from the output of a corresponding latch in master latch circuit 78 and providing a latched version of the undecoded address signal on its output. The clock inputs to the master latches 78 are inverted with respect to the clock inputs on the slave latches 80, so the master-slave latch pairs form master-slave registers. As each clock pulse is applied on clock line 92, another set of undecoded address signals ADD is loaded into the front end of circuit 74.

The clock signal CLK on line 92 is processed by control logic 94 to produce an internal clock ICLK that is immune to duty-cycle changes in CLK. The internal clock signal ICLK is delayed by a known delay using a chain of back-to-back inverters in delay element 96.

Logic gate 86 is clocked by the delayed version of the internal clock. Each time a clock pulse is received, the word line signals on the output of final decoder 84 are released onto the word lines WL at point P2 and are used to address the memory array connected to the word line outputs 90.

The conventional arrangement of FIG. 5 has fixed timing characteristics. Each time the clock signal CLK cycles, the registers formed by the master-slave latch pairs of circuits 78 and 80 clock another set of address signals onto the lines at point P1. Because the delay time of delay element 96 is fixed, the signal delay between points P1 an P2 is fixed and cannot be adjusted.

Figure 6:
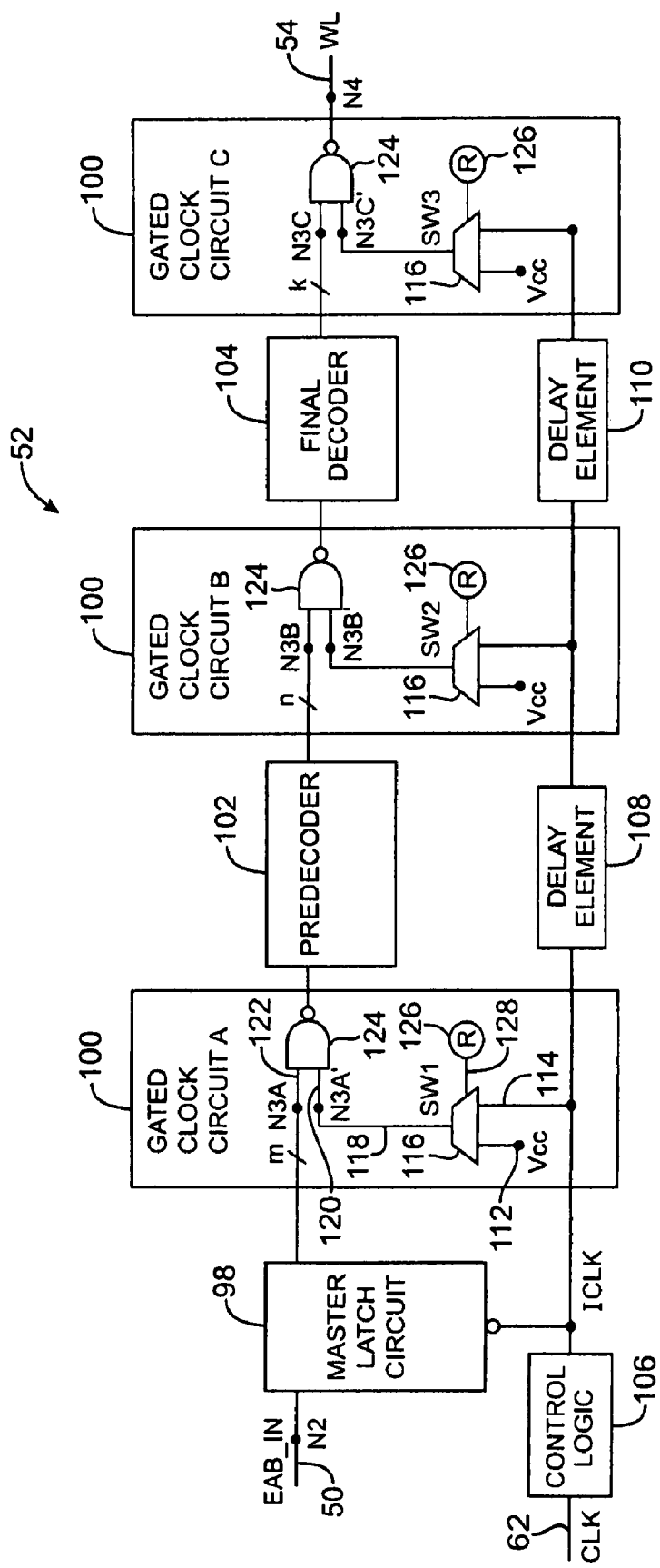
FIG. 6 is a diagram of adjustable programmable logic device memory block decoder circuitry in accordance with the present invention.

Memory block register and address decoder circuitry 52 in accordance with the present invention is shown in FIG. 6.

Circuit 52 may be used in a memory block circuit of the type shown in FIG. 4. Undecoded address signals are applied to EAB_IN input 50. Master latch circuit 98 contains multiple latches, each latch receiving a respective one of the undecoded address signals on its input and providing a latched version of the undecoded address signal on its output. The slave latch circuit 74 of the conventional arrangement in FIG. 5 is replaced by three gated clock circuits 100. The three illustrative gated clock circuits 100 in FIG. 6 are labeled gated clock circuit A, gated clock circuit B, and gated clock circuit C.

With the arrangement of FIG. 6, a logic designer can route clock signals through an desired one of the gated clock circuits 100 to adjust the timing characteristics of the circuit 52. When gated clock circuit A is switched into use, the master latches in master latch circuit 98 form master-slave registers with matching gated clock logic gates in gated clock circuit A. When gated clock circuit B is switched into use, the master latches in master latch circuit 98 form master-slave registers with respective gated clock logic gates in gated clock circuit B. Gated clock circuit C is used when it is desired to form registers from the master latches and respective logic gates in gated clock circuit C.

A clock signal CLK is applied to clock line 62. Control logic 106 may be used to convert the external clock signal CLK to an internal clock signals ICLK, which is immune to changes in the duty cycle of CLK.

Delay elements 108 and 110, which may each exhibit about half of the delay of the conventional delay element 96 of FIG. 5, contain back-to-back inverters or other delay circuitry to impose signal delays on the internal clock.

The delayed clock signal output from delay element 108 is applied to the clock input of gated clock circuit B. The delayed clock signal output from delay element 110 is applied to the clock input of gated clock circuit C.

In the illustrative example of FIG. 6, the address decoder logic of circuit 52 is provided using a two-stage architecture. A first stage of address decoding is performed by predecoder 102. A second stage of address decoding is performed by final decoding 104. This is merely illustrative. Any suitable number of address decoder stages may be used if desired (e.g., three, four, etc.).

Each gated clock circuit 100 contains multiple logic gates 124, each of which receives a corresponding input signal. For example, gated clock circuit A receives m address signals, so there are m corresponding gates 124. Only one gate 124 is shown in each gated clock circuit 100 in FIG. 6 to avoid over-complicating the drawing.

Multiplexers 116 each have two signal inputs and one signal output. One of the signal inputs is connected to a logic high data source 112 (e.g., a positive power supply voltage Vcc). The other of the signal inputs is connected to a clock input line 114. The output 118 of each multiplexer provides either the fixed logic high signal or the clock signals to the gates 124 in its gated clock circuit.

Each multiplexer 116 has a control input 128 that receives a static control signal from a respective programmable element 126 (i.e., a respective configuration RAM bit cell). By loading these programmable elements with appropriate configuration data, a logic designer can selectively pass clock signals to gates 124.

Each multiplexer 116 and its associated programmable element 126 serves as a programmable switch. In the example of FIG. 6, these switches are labeled SW1, SW2, and SW3. If the logic designer desires to register the address signals using the gates 124 in the second gated clock circuit 100 (i.e., gated clock circuit B), the logic designer loads configuration data into the programmable logic device that turns off switches SW1 and SW3 (by connecting their outputs to Vcc) and turns on switch SW2.

The logic gates 124 corresponding to the switches that have been turned off are placed in a static pass-through condition that allows their address signal inputs to pass to their outputs. The logic gates 124 associated with the switch (e.g., SW2 in this example) that has been turned on each operate as a slave latch in cooperation with a corresponding master latch in master latch circuit 98 and thereby form master-slave registers. In the example of FIG. 6, the logic gates 124 are NAND gates, but this is merely illustrative. By using suitable polarity conventions, the NAND gates can be replaced by other suitable gates (e.g., AND, OR, etc.).

The timing characteristics of circuit 52 in various user-selected configurations are illustrated by the entries in the table of FIG. 7. In the table of FIG. 7, the states of switches SW1, SW2, and SW3 are indicate by ones and zeros. Entries of "1" indicate that the corresponding switch is on. Entries of "0" indicate that the corresponding switch is off. For example, in the first row of the table, switch SW1 is on, switch SW2 is off, and switch SW3 is off.

The entries in the rightmost two columns of each row in the table of FIG. 7 indicate the resulting setup and clock-to-output values for circuit 52. The illustrative circuitry of FIG. 4 is typical for a programmable logic device. Signals are generated at the registered output of a region of programmable logic (represented by register R1). These signals are used as address signals for reading data from memory block 22. The resulting output data from memory block 22 is passed to another region of programmable logic. Before being used for additional logic functions, however, the resulting output data is registered using registers such as registers R2. The user logic 68 and 70 of FIG. 4 illustrates how a logic designer may implement programmable logic functions in the path between R1 and R2 using programmable logic.

FIGS. 4 and 6 are labeled using circuit position labels N2, N3A, N3B, etc. These labels illustrate the origins of the setup and clock-to-output times associated with circuit 64. A first clock-to-output time Tco1 is associated with N1 and N2. Signals at N2 must be valid at a time Tco1 after the clock is asserted at N1. A first setup time Tsu1 is associated with N2 and N3A (when SW1 is on), N3B (when SW2 is on), or N3C (when SW3 is on). The output signals from the gated clock circuit (A, B, or C) that has been enabled are valid at a time Tsu after the corresponding address signal appears at the input to the memory block 22 (N2).

A second clock-to-output time Tco2 is also associated with the memory block 22. In particular, the signals at N5 must be valid at a time Tco2 after the clock input at the associated enabled gated clock circuit (A, B, or C) is asserted. The setup time Tsu2 is associated with signals traveling between N5 and N6. Signals must be valid at N6 (the input to register R2) at a time Tsu2 after signals are presented to N5.

The entries in the right-hand two columns of the table of FIG. 7 are labeled using the circuit location labels (e.g., N2, N3A, . . . ) that are shown in FIGS. 4 and 6. Each row of the table has a different illustrative set of switch configurations and therefore corresponds to a different set of timing characteristics for the memory decoder circuitry of FIG. 6.

As an example, consider the configuration of the first row of the table of FIG. 7. When the logic designer loads configuration data bits into the programmable elements 126 of FIG. 6 that turn on switch SW1 in gated clock circuit A and turns off switches SW2 and SW3 in gated clock circuits B and C, the clock input to gated clock circuit A is enabled and the clock inputs to gated clock circuits B and C are disabled. As a result, the m logic gates 124 in gated clock circuit A are combined with the m master latches in master latch circuit 98 to form m corresponding registers. The setup time Tsu1 of circuit 64 in this configuration is at a minimum. The setup time Tsu1 is relatively short, because the address signals are registered by the registers formed using gated clock circuit A, which receives its clock ICLK without any delay. The clock-to-output time Tco2 in this configuration is associated with the clock signal received at N3A' and is therefore at a maximum.

In the situation represented by the second row of table 7, gated clock circuit B is enabled and gated clock circuits A and C are disabled. As a result, the gates 124 in gated clock circuit B serve as slave latches for the master latches of master latch circuit 98. The time Tsu1 is associated with the delay between N2 and N3B. The time Tco2 is associated with the delay between N3B' and N5. Because of the presence of delay element 108, the value of Tsu1 in row two is higher than in row 1 and the value of Tco2 in row two is lower than in row 1.

When the decoder is configured as shown in the third row of table 7, the clock signal ICLK is blocked from gated clock circuits A and B and is passed through delay elements 108 and 110 to the gates 124 in gated clock circuit C. As a result, the value of Tsu1, which is associated with the delay between N2 and N3B, is at a maximum. The value of Tco2, which is associated with the delay between N3C' and N5, is at a minimum.

As this example demonstrates, there is a tradeoff between the setup time Tsu1 and the clock-to-output time Tco2, which can be adjusted by the logic designer. This allows the logic designer to optimize the timing characteristics of the decoder circuitry to improve device performance. For example, if the maximum clock frequency of circuit 64 was being affected by a relatively large value of Tco2, the logic designer could adjust circuit 52 so that gated clock circuit C is enabled, thereby minimizing Tco2. In this situation, the value of Tsu1 would rise by an amount corresponding to the reduction in Tco2, but an overall improvement in fmax would be achieved by relieving the bottleneck imposed by the relatively large value of Tco2 (in this example).

If desired, the logic designer can adjust the circuit 52 to make tradeoffs between Tsu1 and Tco2 to satisfy other timing constraints. For example, the logic designer can configure circuit 52 to accommodate a desired logic design which requires a smaller value of memory setup time Tsu1, without affecting fmax.

The registers that are formed by combining the master latches of master latch circuit 98 with respective logic gates 124 (e.g., respective NAND gates) in the gated clock circuits can be used to form scan chains. The use of scan chains in programmable logic devices is well known. By forming a temporary scan chain, data may be loaded or unloaded from a chain of registers on the device. Scan chains are generally used during circuit testing.

Figure 8:
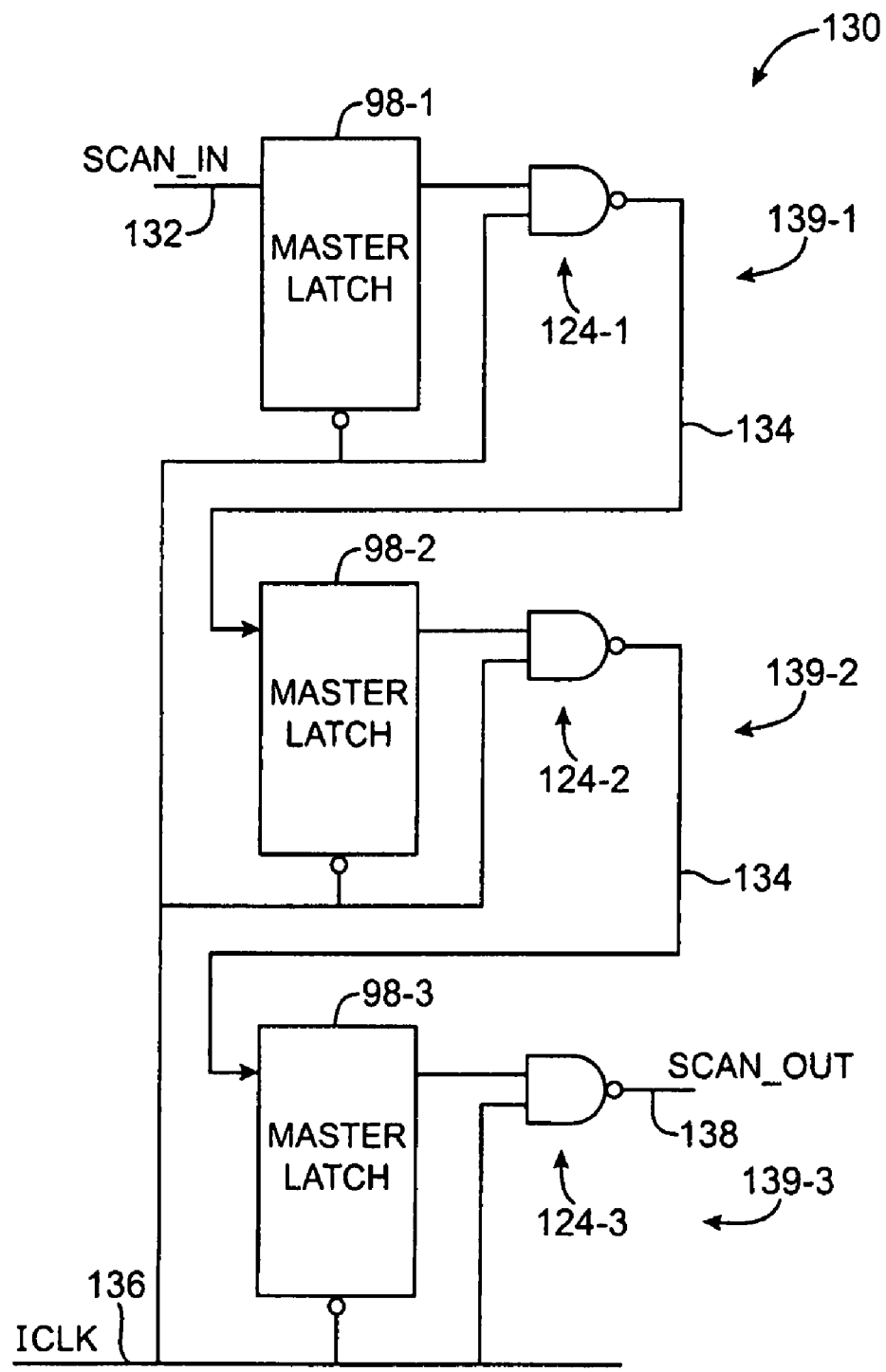
FIG. 8 is a circuit diagram showing how adjustable programmable logic device memory block decoder circuitry may be configured as a scan chain in accordance with the present invention.

An illustrative scan chain 130 of the type that may be formed from the gated clock circuits on a programmable logic device integrated circuit in accordance with the present invention is shown in FIG. 8. In the example of FIG. 8, the scan chain is formed from three registers, each of which includes a master latch and a gated clock circuit logic gate. Register 139-1 is formed from master latch 98-1 and gated clock circuit logic gate 124-1. Register 139-2 is formed from master latch 98-2 and gated clock circuit logic gate 124-2. Register 139-3 is formed from latch 98-3 and gate 124-3.

Clock signals are provided to registers 139-1, 139-2, and 139-3 via clock path 136 by programming switches such as switches SW1, SW2, and SW3 in FIG. 6. Scan chain path 134 is formed from programmable interconnects (e.g., by programming the programmable logic device prior to testing).

During scan chain loading, data is clocked into registers 139-1, 139-2, and 139-3 through scan chain input 132. The scan chain can be unloaded (e.g., to examine captured data during a test) using scan chain output 138.

There are generally multiple associated scan chains 130 that can be formed from the programmable interconnect resources, master latches, and gated clock circuits on the programmable logic device 10. A single one of these possible scan chains is shown in FIG. 8 as an example.

Figure 9:
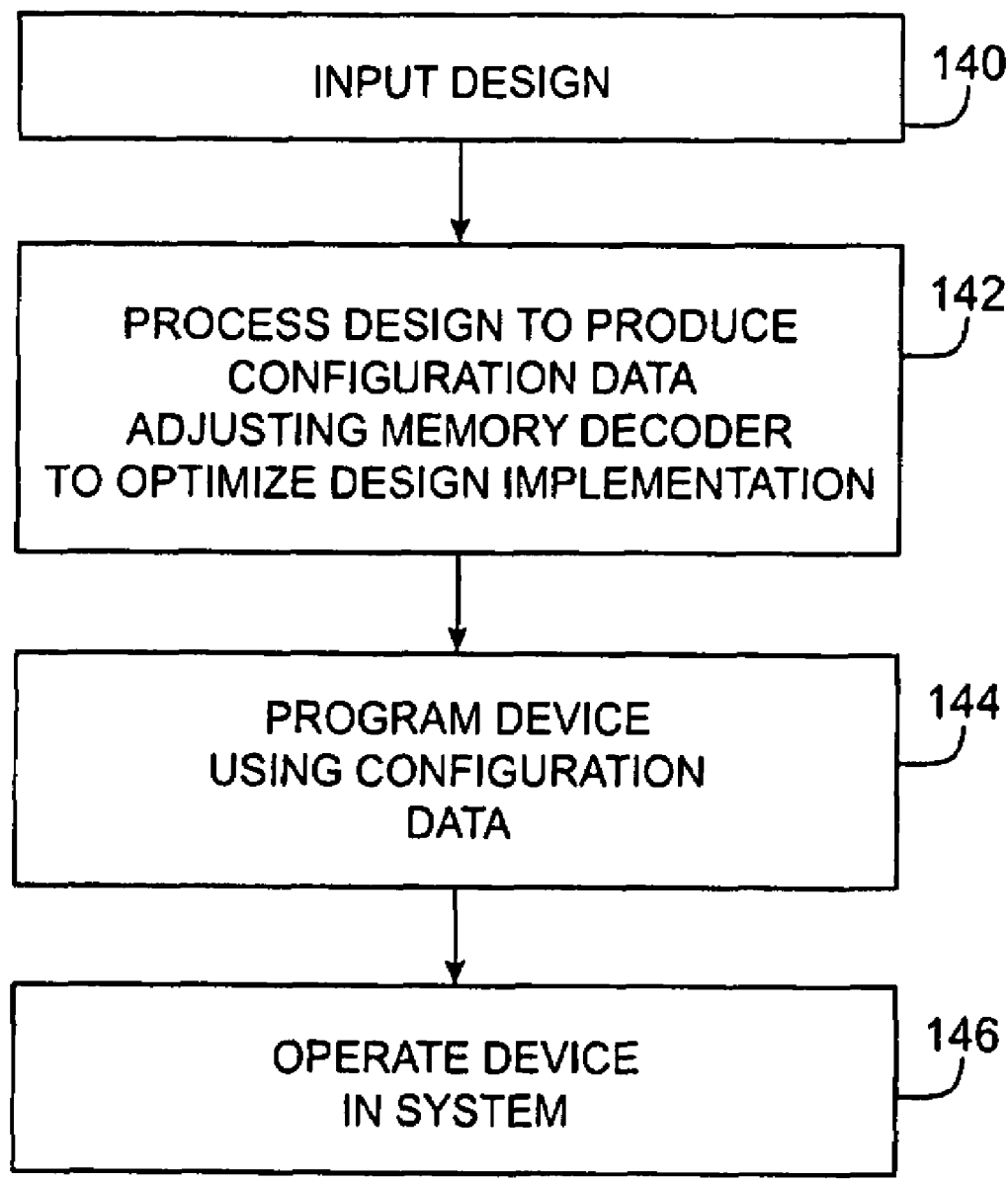
FIG. 9 is a flow chart of illustrative steps involved in using a programmable logic device integrated circuit containing an adjustable memory block decoder in accordance with the present invention.

Illustrative steps involved in using a programmable logic device integrated circuit with adjustable register and memory decoder circuitry are shown in FIG. 9.

At step 140, a logic designer inputs a design using computer-aided design (CAD) tools implemented on computing equipment (e.g., one or more computers such as personal computers or workstations). During step 140, the logic designer uses CAD tools such as design entry tools, initial synthesis tools, and functional simulation tools for operations associated with design entry, initial synthesis, and functional simulation. The CAD tools preferably include tools such as logic synthesis and optimization tools, placement and routing tools, and timing simulation tools for logic synthesis and optimization, physical design, and timing simulation operations.

The CAD tools use input from the logic designer and/or automatically-generated circuit timing analysis results to determine how to best adjust the register and memory decoder circuit 52. Adjusting the timing characteristics of the register and memory decoder circuit 52 allows the performance of the programmable logic device 10 to be enhanced. Information may be gathered from the logic designer by allowing the logic designer to incorporate timing constraints or other settings into the design using appropriate high-level logic design specification languages, by accepting input from a logic designer in response to on-screen options or prompts, or using any other suitable input technique. Automatically-generated results may be produced by using the CAD tools to analyze the design.

Based on manual and/or automatically-generated information, the CAD tools generate configuration data for the logic designer's circuit design during step 142 (i.e., the CAD tools process the design to produce configuration data adjusting the memory decoder to optimize the design implementation). The configuration data that is generated includes configuration data bits for programming configuration RAM such as programmable elements 126 in the gated clock circuits 100 in FIG. 6. The configuration data also includes bits that program the device 10 so that programmable logic 18 forms supporting circuitry and user logic. When forming a scan chain from gated clock circuits, for example, the configuration data includes data that configures programmable logic 18 on the device 10 to form scan paths.

At step 144, the programmable logic device 10 is programmed using the configuration data that was generated during step 142. The configuration data configures the programmable logic device to perform the desired custom logic function of the logic designer. Because the CAD tools that were used during step 142 adjusted the memory decoder circuitry (e.g., to switch a desired gated clock circuit into use as a slave latch circuit), the timing characteristics of the memory decoder circuit are customized to satisfy the logic designer's design constraints (e.g., to maximize fmax, to accommodate a particular setup time constraint, etc.) Accordingly, when the programmed programmable logic device 10 is used in a system at step 146 (i.e., when operating device 10 in a system), performance is enhanced.

What is claimed is:

1. A programmable logic device integrated circuit comprising:
   a memory array having word lines; and
   adjustable register and memory address decoder circuitry that receives address signals and applies word line signals to the word lines to address the memory array, wherein the adjustable register and memory address decoder circuitry includes a master latch circuit and a plurality of gated clock circuits and wherein a given one of the gated clock circuits is switched into use to adjust timing characteristics of the adjustable register and memory address decoder circuitry.

2. The programmable logic device integrated circuit defined in claim 1 wherein the master latch circuit comprises a plurality of master latches, the programmable logic device integrated circuit further comprising:
   a plurality of logic gates in the given one of the gated clock circuits that form master-slave registers with the master latches.

3. The programmable logic device integrated circuit defined in claim 1 wherein the master latch circuit comprises at least one master latch, wherein the given gated clock circuit contains at least one logic gate, wherein the programmable logic device integrated circuit comprises at least one clock line that applies a clock signal to the logic gate.

4. The programmable logic device integrated circuit defined in claim 1 further comprising a scan path that connects circuitry in the master latch circuitry and the given one of the gated clock circuits to form a scan chain.

5. The programmable logic device integrated circuit defined in claim 1 wherein the adjustable register and memory address decoder circuitry comprises at least a first address decoder and a second address decoder and wherein at least one of the gated clock circuits is connected between the first address decoder and the second address decoder.

6. The programmable logic device integrated circuit defined in claim 1 wherein the adjustable register and memory address decoder circuitry comprises at least a first address decoder and a second address decoder and wherein at least a first one of the gated clock circuits is connected between the master latch circuit and the first address decoder and at least a second one of the gated clock circuits is connected between the first address decoder and the second address decoder.

7. The programmable logic device integrated circuit defined in claim 1 wherein the adjustable register and memory address decoder circuitry comprises at least a first address decoder and a second address decoder and wherein at least a first one of the gated clock circuits is connected between the master latch circuit and the first address decoder, at least a second one of the gated clock circuits is connected between the first address decoder and the second address decoder, and at least a third one of the gated clock circuits is connected between the second address decoder and the word lines.

8. The programmable logic device integrated circuit defined in claim 1, wherein each gated clock circuit has a plurality of logic gates each of which has a first input that selectively receives a clock signal and at a second input that receives signals from the master latch circuit.

9. The programmable logic device integrated circuit defined in claim 1 wherein the adjustable register and memory address decoder circuitry comprises at least first and second delay elements, wherein the first delay element is connected between respective gated clock circuits and wherein the second delay element is connected between respective gated clock circuits, so that each gated clock circuit receives a clock signal with a different associated delay.

10. The programmable logic device integrated circuit defined in claim 1 wherein each gated clock circuit comprises a clock input and a switch that receives the clock input of that gated clock circuit as one of its inputs, wherein each switch has a state that is controlled by configuration data.

11. The programmable logic device integrated circuit defined in claim 1 further comprising first user-programmed logic and second user-programmed logic, wherein the adjustable register and memory address decoder circuitry is connected between the first user-programmed logic and the memory array, wherein the memory array has an output, wherein the second user-programmed logic is connected to the memory array output, wherein there is a setup time associated with register circuitry in the adjustable register and memory address decoder circuitry, wherein there is a clock-to-output time associated with applying the word line signals on the word lines, and wherein the adjustable register and memory address decoder circuitry is adjusted based on loaded configuration data to change the setup time and the clock-to-output time to accommodate the first user-programmed logic and second user-programmed logic.

12. The programmable logic device integrated circuit defined in claim 1 further comprising a plurality of delay elements each of which delays a clock by a different amount to produce a plurality of clock signals each with a different delay, wherein each gated clock circuit receives a respective one of the clock signals with the different delays.

13. The programmable logic device integrated circuit defined in claim 1 further comprising a plurality of delay elements each of which delays a clock by a different amount to produce a plurality of clock signals each with a different delay, wherein each gated clock circuit comprises programmable switch circuitry that receives a respective one of the clock signals with the different delays.

14. The programmable logic device integrated circuit defined in claim 1 further comprising a plurality of delay elements each of which delays a clock by a different amount to produce a plurality of clock signals each with a different delay, wherein each gated clock circuit comprises programmable switch circuitry that receives a respective one of the clock signals with the different delays and wherein each gated clock circuit comprises a plurality of logic gates.

15. The programmable logic device integrated circuit defined in claim 1 further comprising a plurality of delay elements each of which delays a clock by a different amount to produce a plurality of clock signals each with a different delay, wherein each gated clock circuit comprises programmable switch circuitry having a multiplexer that receives a respective one of the clock signals with the different delays at a first input and that receives a fixed voltage at a second input and that has a multiplexer output, wherein each gated clock circuit comprises a plurality of logic gates, each of which has a first input that receives signals from the master latch circuit and each of which has a second input connected to one of the multiplexer outputs.

16. The programmable logic device integrated circuit defined in claim 1 further comprising a plurality of delay elements each of which delays a clock by a different amount to produce a plurality of clock signals each with a different delay, wherein each gated clock circuit comprises programmable switch circuitry having a multiplexer that receives a respective one of the clock signals with the different delays at a first input and that receives a fixed voltage at a second input and that has a multiplexer output, and wherein each gated clock circuit comprises a plurality of NAND gates, each of which has a first input that receives signals from the master latch circuit and each of which has a second input connected to one of the multiplexer outputs.

17. The programmable logic device integrated circuit defined in claim 1 further comprising a plurality of delay elements each of which delays a clock by a different amount to produce a plurality of clock signals each with a different delay, wherein each gated clock circuit comprises programmable switch circuitry having a multiplexer that receives a respective one of the clock signals with the different delays at a first input and that receives a fixed voltage at a second input and that has a multiplexer output, wherein each gated clock circuit comprises a plurality of logic gates, each of which has a first input that receives signals from the master latch circuit and each of which has a second input connected to one of the multiplexer outputs, and wherein the master latch circuit comprises a plurality of master latches that form master-slave registers with the logic gates of the given one of the gated clock circuits.

18. A programmable logic device integrated circuit comprising:
   a random-access-memory array having word lines; and
   adjustable register and memory address decoder circuitry that receives address signals and applies word line signals to the word lines to address the memory array, wherein the adjustable register and memory address decoder circuitry includes a master latch circuit containing a plurality of master latches, at least first and second address decoders, at least first, second, and third programmable gated clock circuits each of which receives a clock signal having a different amount of delay, wherein the first second, and third programmable gated clock circuits are controlled by first, second, and third programmable elements to switch a given one of the programmable gated clock circuits into use to serve as a slave latch circuit and to adjust a setup time associated with the adjustable register and memory address decoder circuitry, wherein the first address decoder is connected between the first and second gated clock circuits, and wherein the second address decoder is connected between the second and third gated clock circuits.

19. The programmable logic device integrated circuit defined in claim 18 further comprising:
   circuitry that supplies an internal clock; and
   first and second delay elements, wherein the first delay element delays the internal clock by a first amount and applies the internal clock that has been delayed by the first amount to the second gated clock circuit and wherein the second delay element delays the internal clock by a second amount and applies the internal clock that has been delayed by the second amount to the third gated clock circuit.

20. The programmable logic device integrated circuit defined in claim 18, wherein the memory array is contained within a programmable logic device memory block, the programmable logic device integrated circuit further comprising:
   a plurality of logic gates in the first, second, and third gated clock circuits each of which has logic gate inputs and an output;
   circuitry that supplies an internal clock; and
   first and second delay elements, wherein the first delay element delays the internal clock by a first amount and applies the internal clock that has been delayed by the first amount to the logic gate inputs in the second gated clock circuit and wherein the second delay element delays the internal clock by a second amount and applies the internal clock that has been delayed by the second amount to the logic gate inputs in the third gated clock circuit.

* * * * *